US012607662B2

(12) United States Patent
Sun et al.

(10) Patent No.: US 12,607,662 B2
(45) Date of Patent: Apr. 21, 2026

(54) PHASE IDENTIFICATION OF POWER DISTRIBUTION SYSTEMS

(71) Applicant: Mitsubishi Electric Research Laboratories, Inc., Cambridge, MA (US)

(72) Inventors: Hongbo Sun, Lexington, MA (US); Zong-Jhen Ye, Riverside, CA (US); Jianlin Guo, Newton, MA (US); Ye Wang, Andover, MA (US)

(73) Assignee: Mitsubishi Electric Research Laboratories, Inc.

( * ) Notice: Subject to any disclaimer, the term of this patent is extended or adjusted under 35 U.S.C. 154(b) by 212 days.

(21) Appl. No.: 18/582,888

(22) Filed: Feb. 21, 2024

(65) Prior Publication Data

US 2025/0264513 A1 Aug. 21, 2025

(51) Int. Cl.
| | |
|---|---|
| *G01R 29/18* | (2006.01) |
| *G01D 4/00* | (2006.01) |
| *G01R 19/25* | (2006.01) |
| *H02J 13/00* | (2006.01) |

(52) U.S. Cl.
CPC ............ *G01R 29/18* (2013.01); *G01D 4/004* (2013.01); *G01R 19/2513* (2013.01); *H02J 13/00002* (2020.01); *H02J 13/00006* (2020.01)

(58) Field of Classification Search
CPC .... G01R 29/18; G01R 19/2513; G01D 4/004; H02J 13/00002; H02J 13/00006; H02J 3/0012; H02J 3/26
See application file for complete search history.

(56) References Cited

U.S. PATENT DOCUMENTS

| | | | | |
|---|---|---|---|---|
| 10,120,401 | B2 * | 11/2018 | Song | H02J 3/14 |
| 2022/0146557 | A1 * | 5/2022 | Hao | H02J 13/00026 |
| 2023/0160941 | A1 * | 5/2023 | Sloop | H02J 13/00022 |
| | | | | 324/512 |

FOREIGN PATENT DOCUMENTS

| | | |
|---|---|---|
| EP | 12180555 A | 8/2012 |

OTHER PUBLICATIONS

S. J. Pappu, N. Bhatt, R. Pasumarthy and A. Rajeswaran, "Identifying Topology of Low Voltage Distribution Networks Based on Smart Meter Data," in IEEE Transactions on Smart Grid, vol. 9, No. 5, pp. 5113-5122, Sep. 2018, doi: 10.1109/TSG.2017.2680542.
B. K. Seal and M. F. McGranaghan, "Automatic identification of service phase for electric utility customers," 2011 IEEE Power and Energy Society General Meeting, Detroit, MI, USA, 2011, pp. 1-3, doi: 10.1109/PES.2011.6039623.

* cited by examiner

*Primary Examiner* — Giovanni Astacio-Oquendo
(74) *Attorney, Agent, or Firm* — Gene Vinokur

(57) ABSTRACT

Method and system for phase detecting of hybrid wye-connected and delta-connected loads in an unbalanced power distribution system. A data-driven event-triggered phase identification algorithm is presented in which the exceeding current fluctuation events are used to build the relationship between the feeder head and the undetermined phase load and mutual information index is used to assess the dependence level of the feeder head on the undetermined phase load. The connected and non-connected phase of wye-connected and delta-connected single-phase load are determined as the phase having highest and lowest dependences of the phases of feeder head on the load, respectively.

21 Claims, 8 Drawing Sheets

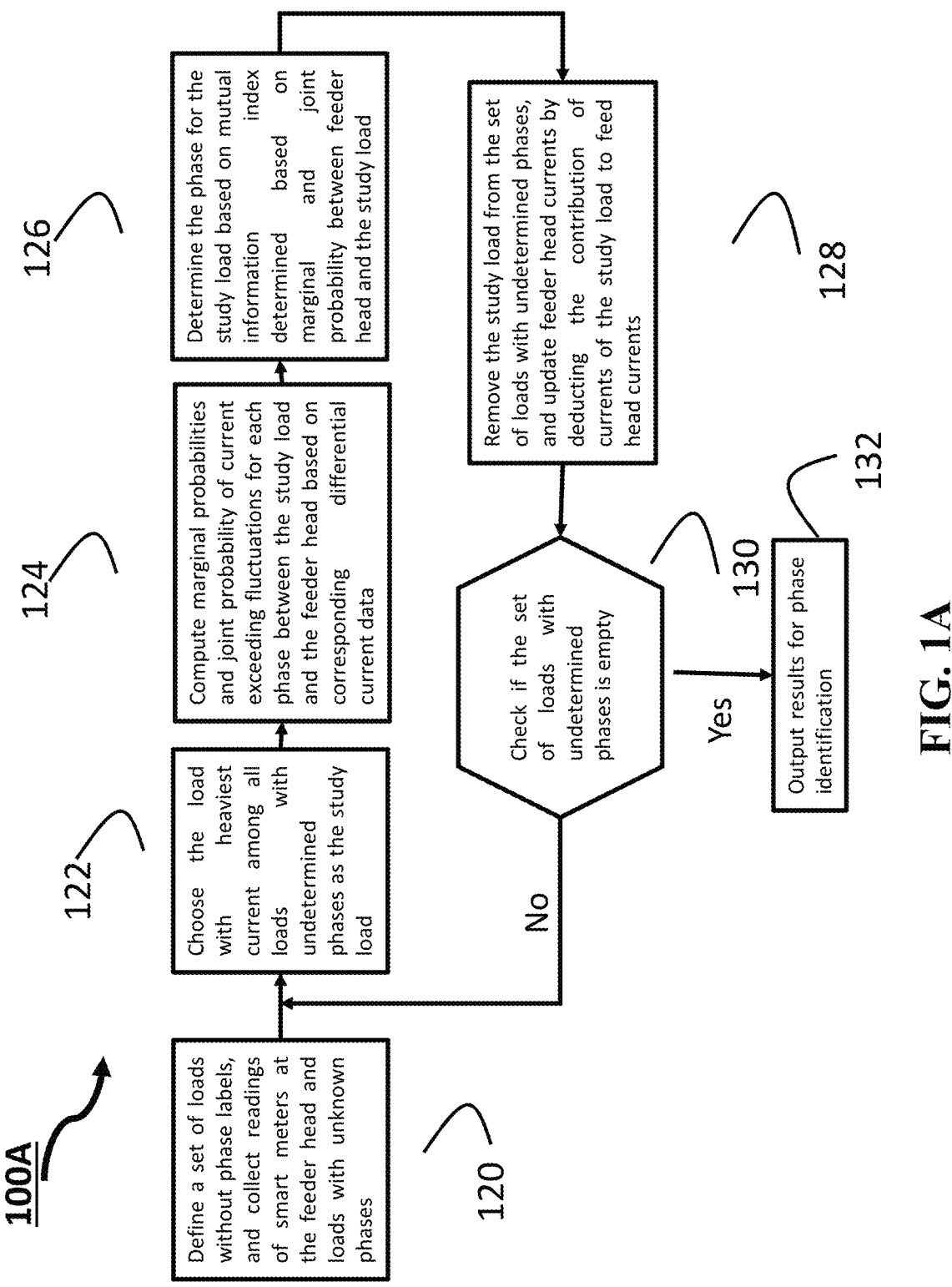

100A

120 — Define a set of loads without phase labels, and collect readings of smart meters at the feeder head and loads with unknown phases 122 — Choose the load with heaviest current among all loads with undetermined phases as the study load 124 — Compute marginal probabilities and joint probability of current exceeding fluctuations for each phase between the study load and the feeder head based on corresponding differential current data 126 — Determine the phase for the study load based on mutual information index determined based on marginal and joint probability between feeder head and the study load 128 — Remove the study load from the set of loads with undetermined phases, and update feeder head currents by deducting the contribution of currents of the study load to feed head currents 130 — Check if the set of loads with undetermined phases is empty No Yes 132 — Output results for phase identification

FIG. 1A

PHASE IDENTIFICATION OF POWER DISTRIBUTION SYSTEMS

TECHNICAL FIELD

The present invention relates generally to system and method for phase identification of power distribution systems, and more particularly to identifying connected phases of wye-connected and delta-connected loads of power distribution systems under high penetration of renewable.

BACKGROUND

With the development of digital energy applications, electricity utilities are under increasing pressure to have accurate models of the power distribution systems. This pressure stems in part from the ever-increasing penetration of distributed energy resources (DER) inside the power distribution systems. Inaccuracies in the power distribution system models will affect the effectiveness and efficiency of system operation and control. The task of determining the phase connection of electricity customers, known as phase identification, is crucial to obtain accurate power distribution system models. Better accuracy in phase labels can bring several critical benefits to the utilities, such as using more precise models to balance the loads of all three phases for reducing losses and overloads, improving service power quality of customers, providing more accurate hosting capacity analyses for managing increasing installations of DERs.

Phase identification is frequently demanded when a restoration is conducted after a natural disaster or following a severe weather event, or when a new load or meter is deployed.

Ideally, if all customer sides have been deployed with advanced sensors with phasor measuring capability, the phase identification for customers connected to a power distribution system can be resolved easily by simply comparing phase angles provided by the sensors. As the power distribution system usually has a very large number of customers and each such advanced sensor is not cheap, it would be too expensive for the power distribution system to set up synchronized phasor measurement capabilities on the customer side. A practical solution is utilizing the measurements provided by the commonly used measuring devices, i.e., smart meters installed at the customer sides of power distribution systems. Traditionally, smart meters are used by the electricity utilities to measure the real power consumption of customers. Due to the absence of direct phase angle measurements, phase identification cannot ultimately be solved by only using real power measurements. To this end, the present invention also utilizes the other measurements that are providing by newly smart meters to identifying the phases of customers, including reactive power and the magnitude of voltage.

The complexity of phase identification is also contributed by the load connection of electricity customers in the power distribution system. Load connection defines how electricity customers are fed from the distribution transformer among three phases. It may be a wye connected in which each phase load is connected between a phase wire and a neutral wire, or a delta connected in which each phase load is connected between a pair of phase wires. A disturbance or event, such as a voltage sag that happens in the power distribution system may affect these load connections differently. A wye connection load can only reflect the event signature on the corresponding phase of the feeder where the disturbance takes place. A delta connection load can reflect the event signature on two phases at the same time. The cross interference can deteriorate the traditional methods on phase identification that make use of correlation or regression across the event signatures. Therefore, solving the phase identification problem is very difficult when the load connections are a mix of both wye and delta connections. Moreover, the power demand of a customer may be served by a single-phase load, two-phase load, or three-phase load. Coupling between different phase loads may further complicate the phase identification for an unbalanced distribution system.

To overcome the challenges for relying on smart meters on phase identification, such as limited measurement locations, low sampling/reporting rates in measurements, and lack of labeled data or inaccuracy in topology information, the present invention uses advanced smart meters to improve the measurement capabilities, including higher sampling rates, such as one reading per minute from each smart meter and recording not only real power but also reactive power and the magnitude of voltage on the customer side. Based on the above realistic capabilities from smart meters, the accuracy of phase identification can be further improved by designing phase identification technologies suitable for hybrid wye and delta load connections in the unbalanced distribution system.

Three broad classes of methods, namely hardware-based, real-power based, and voltage-based approaches, have been proposed to address the phase identification problem in unbalanced power distribution systems.

Hardware-based methods require installation of certain probing devices on both the substation and customer sides. They ensure accuracy but the device installations can be costly and labor intensive. One example of hardwire based approaches is the method disclosed by P. Kulkarni and A. R. Kolwalkar, "Phase identification system and method," EP Patent 2 562 554 A3, Jun. 25, 2014. A phase identification system includes a power distribution station and a phase detection device. The power distribution station includes a phase distortion device for generating voltage distortions of a known harmonic frequency in at least one of three phase voltage signals of the power distribution station. The phase detection is configured to receive at least one of distorted three phase voltage signals and to identify a phase of the received voltage signal. A phase determination module in the phase detection device determines the phase of the received voltage signal by comparing an amplitude of a harmonic of the known harmonic frequency in the received voltage signal with a threshold value.

Real power-based methods take the power consumption or power generation time series measurements and apply the power conservation equations to all power consumption and power injection measurements to each phase. The accuracy highly depends on the number of loads, the topology of the network, and the number of available smart meters. Example of real-power based approaches can be found at a paper authored by S. J. Pappu, N. Bhatt, R. Pasumarthy, and A. Rajeswaran, "Identifying topology of low voltage distribution networks based on smart meter data," IEEE Trans. Smart Grid, vol. 9, no. 5, pp. 5113-5122 September 2018. In this paper, a novel data driven approach is proposed to identify the underlying network topology for LV distribution networks including the load phase connectivity from time series of energy measurements. The present invention involves the application of principal component analysis and its graph-theoretic interpretation to infer the steady state network topology from smart meter energy measurements.

Voltage-based methods assess the correlations in the voltage variations across the smart meters to identify which customers are on the same phase. Such approaches require voltage variation signatures should be significant enough for identification. Example of Voltage-based methods can be found at the paper authored by B. K. Seal and M. F. McGranaghan, "Automatic identification of service phase for electric utility customers," in Proc. IEEE Power Energy Soc. Gen. Meeting, Detroit, MI, USA, July 2011, pp. 1-3. The authors propose an approach that finds 'events' that are unique to each phase within the substation supervisory control and data acquisition (SCADA) measurements and then calculate correlation coefficients between customer voltage time series and the identified events.

However, those existing approaches are not fully capable for solving phase identification of complicated power distribution systems with mixed wye and delta connected loads, varied penetration rates of smart meters and PVs, and insufficient information on data labeling, line impedance, and topology connectivity.

Therefore, there is a need to develop a system and method enabling more accurate phase identification.

SUMMARY OF THE INVENTION

Some embodiments of the present invention are based on recognition that phase identification is a critical and challenging task in a power distribution system that has both wye and delta connection loads. It is even more challenging if the power distribution system has a high penetration of photovoltaic (PV) distributed power generation resources. A datadriven event-triggered phase identification method is invented by applying the information theory to analyze the measurements collected from advanced smart meters to recognize the phases. The disclosed method is based on a joint analysis of the event signatures between the customer locations and the feeder head. By examining the cross entropy from their mutual information, the disclosed method can effectively identify the correct phases at both wye and delta connected loads. Meanwhile, although the phase identification method is proposed for wye and delta connected single-phase load, the proposed method can also be applicable to wye and delta connected two-phase loads and three-phase loads by equivalencing the two-phase as two independent single-phase loads, and the three-phase load as three independent single-phase loads.

The disclosed method identifies the connected phases of loads based on the smart meter measurements in the customer sides and corresponding synchronized measurements at feeder head collected from smart meters or other sensors using information theory. The disclosed method is based on a joint analysis of the event signatures described by current exceeding fluctuations for each phase between the customer locations and the feeder head. The correct phases at both wye and delta connected loads is identified through examining the cross entropy from their mutual information.

The disclosed method can identify the unknown phase even if many of the loads are wye connected and many are delta connected. The disclosed method can identify the phases with different penetration of PVs when the smart meter penetration is 100%. Even when the smart meter penetration rate is low, the disclosed method can still work with close to perfect accuracy.

The present invention is based on information theory. One key advantage is that the calculation burden is low. Furthermore, it does not need a huge dataset to solve the phase identification problem despite the above various challenges.

Since the present invention is not a deep learning or machine learning method, neither labels nor training is needed. The present invention also not rely on the topology or line impedance.

According to some embodiments of the present invention, a phase detecting system is provided for detecting phases of loads in a power distribution system. The phase detecting system may include: a signal interface configured to receive measurements from sensors connected to feeder heads and loads on the power distribution system, wherein the measurements include a real power, a reactive power, and a voltage magnitude for each phase of the feeder heads and each phase of the loads, wherein the loads include a set of loads with undetermined phases; at least one processor; and a non-transitory computer-readable medium having stored thereon a set of instructions for detecting phases of the loads, which when performed by the at least one processor, causes the at least one processor to performs steps of: storing, by selecting from the measurements, for a set of time intervals, current magnitude timeseries for each phase of the feeder heads and each phase of the loads with undetermined phases in a memory, wherein the current magnitude timeseries include current magnitudes at measured time intervals, wherein the current magnitudes are computed from the real powers, the reactive powers, and the voltage magnitudes, wherein each of the real powers, each of the reactive powers, and each of the voltage magnitudes corresponds to an interval among the set of measuring intervals; selecting a load indicating a greatest current magnitude from the set of loads with undetermined phases as a study load by a statistic detecting algorithm; determining exceeding current fluctuation events from the current magnitude timeseries at each phase of the feeder heads and the study load based on a threshold current range; computing a first marginal probability distribution for the exceeding current fluctuation events on each phase of the feeder heads, a second marginal probability distribution for the exceeding current fluctuation events at the study load, and a joint probability distribution for joint exceeding current fluctuation events for each combination of phases of the feeder heads and the study load; determining a phase for the study load based on dependence of each phase of the feeder heads on the study load according to mutual information index determined by the first and second marginal probability distributions of the exceeding current fluctuation events and the joint probability distribution of the joint exceeding current fluctuation events; updating the current magnitude timeseries at the feeder heads by a current disaggregation algorithm for equivalent current of the study load based on measured real powers, reactive powers and voltage magnitudes at the study load, and removing the study load from the set of loads with undetermined phases stored in the memory; and determining if there is a load indicating an undetermined phase in the set of loads with undetermined phases in the memory, then continuing the steps of the selecting through the updating until the set of loads with undetermined phase becomes empty, otherwise generating and outputting a dataset of the determined phases for loads.

This invention describes a phase detecting method for detecting connected phases of loads in an unbalanced three-phase power distribution system. The phase detecting method can include: receiving measurements from the sensors via a signal interface, wherein the sensors are connected to a feeder head and loads on the power distribution system, wherein the measurements indicate a real power, a reactive power and a voltage magnitude at each phase of the feeder head and each phase of loads, wherein loads include determined phase loads and undetermined phase loads; storing current magnitude time series at all phases of the feeder head and the undetermined phase loads in a memory for a set of measuring intervals, wherein current magnitudes are derived according to corresponding real and reactive powers and voltage magnitude measurements; selecting a load indicating a greatest current magnitude among the undetermined phase loads stored in the memory as a study load; identifying occurrences of exceeding current fluctuations on each phase of the feeder head and at the study load based on a threshold range defined according to the currents of the study load; computing a marginal probability distribution for exceeding current fluctuation on each phase of the feeder head, a marginal probability distribution for exceeding current fluctuation at the study load, and a joint probability distribution for joint exceeding current fluctuations for each combination of a phase of the feeder head and the study load; determining the phase for the study load based on dependence of each phase of the feeder head on the study load according to mutual information index determined by the marginal probability distributions of exceeding current fluctuations on the phases of feeder head and the study load and the joint probability distributions of joint exceeding current fluctuations for the combinations of phases of the feeder head and the study load; updating the current at the feeder head by deducing a current of the study load and removing the study load from the undetermined phase loads stored in the memory; and searching if a load indicating an undetermined phase is not existing in the undetermined phase loads, outputting the phases of the loads identified by the determining, otherwise continuing steps of the selecting, identifying, computing, determining, and the updating until load indicating an undetermined phase is not existing.

Further, the phase detecting method may be a computer-implemented method that is stored in a non-transitory computer-readable medium having stored thereon a set of instructions for detecting phases of the loads, which when performed by the at least one processor, causes the at least one processor to performs steps of: storing, by selecting from the measurements, for a set of time intervals, current magnitude timeseries for each phase of the feeder heads and each phase of the loads with undetermined phases in a memory, wherein the current magnitude timeseries include current magnitudes at measured time intervals, wherein the current magnitudes are computed from the real powers, the reactive powers, and the voltage magnitudes, wherein each of the real powers, each of the reactive powers, and each of the voltage magnitudes corresponds to an interval among the set of measuring intervals; selecting a load indicating a greatest current magnitude from the set of loads with undetermined phases as a study load by a statistic detecting algorithm; determining exceeding current fluctuation events from the current magnitude timeseries at each phase of the feeder heads and the study load based on a threshold current range; computing a first marginal probability distribution for the exceeding current fluctuation events on each phase of the feeder heads, a second marginal probability distribution for the exceeding current fluctuation events at the study load, and a joint probability distribution for joint exceeding current fluctuation events for each combination of phases of the feeder heads and the study load; determining a phase for the study load based on dependence of each phase of the feeder heads on the study load according to mutual information index determined by the first and second marginal probability distributions of the exceeding current fluctuation events and the joint probability distribution of the joint exceeding current fluctuation events; updating the current magnitude timeseries at the feeder heads by a current disaggregation algorithm for equivalent current of the study load based on measured real powers, reactive powers and voltage magnitudes at the study load, and removing the study load from the set of loads with undetermined phases stored in the memory; and determining if there is a load indicating an undetermined phase in the set of loads with undetermined phases in the memory, then continuing the steps of the selecting through the updating until the set of loads with undetermined phase becomes empty, otherwise generating and outputting a dataset of the determined phases for loads.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

While the following identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

FIG. 1A is a flowchart for the steps of phase identification method for a power distribution system, according to embodiments of the present disclosure;

DETAILED DESCRIPTION OF THE PREFERRED EMBODIMENTS

The present invention relates generally to power distribution systems, and more particularly to resilient distribution system infrastructure planning. The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

FIG. 1A is a flowchart for the steps of phase identification method for a power distribution system, according to embodiments of the present disclosure.

The method 100A comprises of several steps as described below.

Step 120 identify the a set of loads without phase labels, and collects readings of smart meters at the feeder head, and customer loads with unknown phase labels;

Step 122 chooses the load with heaviest current among all loads with undetermined phases as the study load;

Step 124 computes marginal probabilities and joint probability of current exceeding fluctuations for each phase between the study load and the feeder head based on corresponding differential current data;

Step 126 determines the phase for the study load based on mutual information index determined based marginal and joint probabilities between the feeder head and the study load;

Step 128 updates feeder head currents by deducting the contribution of currents of the study load from feeder head currents, and remove the study load from the set of loads with undetermined phases;

Step 130 checks if the set of loads with undetermined phases is empty. If yes, go to step 132. Otherwise, go to step 122.

Step 132 outputs the results of phase identification to distribution management system, or distribution control system.

Figure 1B:
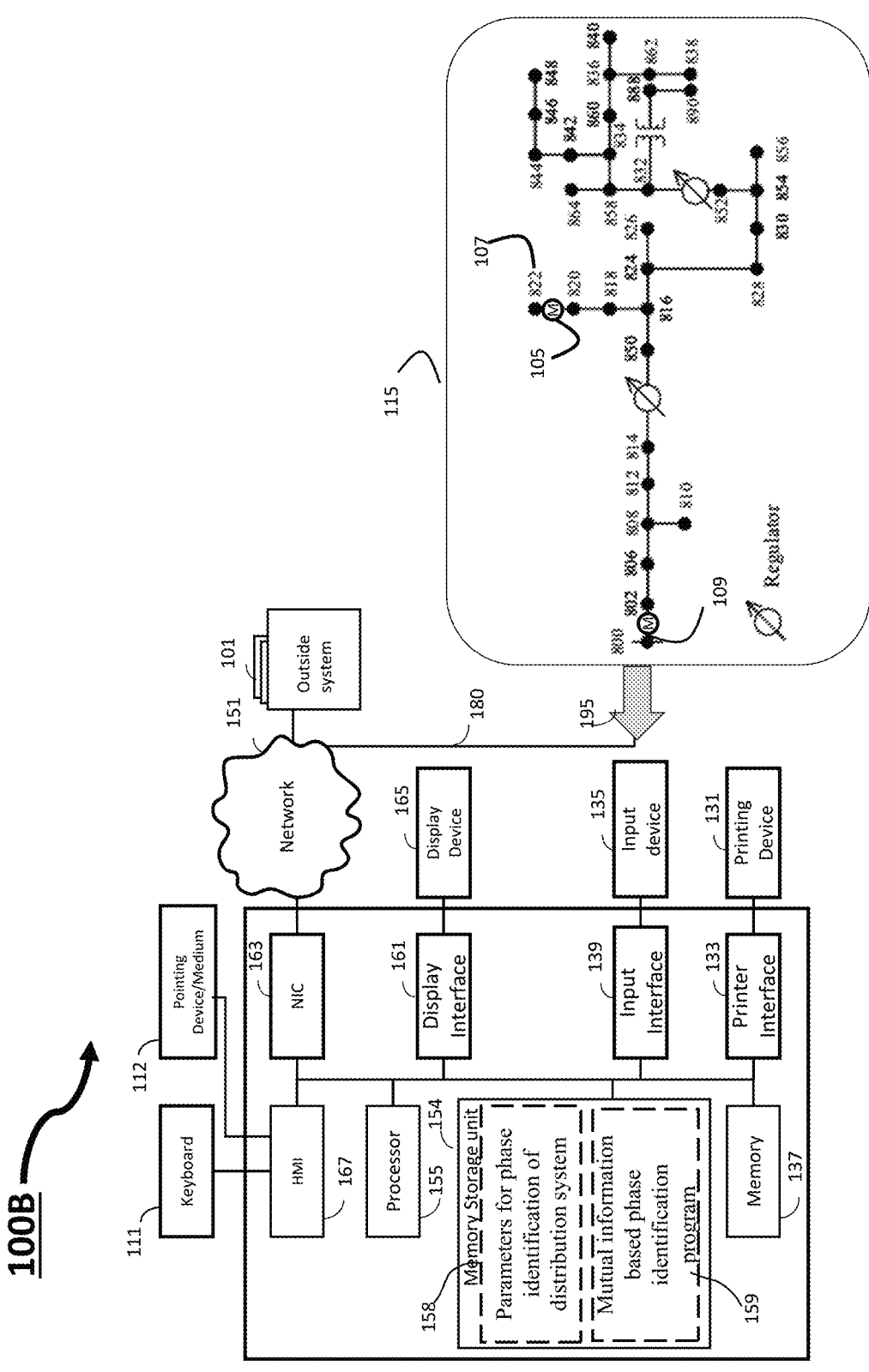
FIG. 1B is a schematic of phase identification system of a power distribution system, according to embodiments of the present disclosure.

FIG. 1B is a schematic of phase identification system of a power distribution system, according to embodiments of the present disclosure.

The phase identification system 100B includes a human machine interface (HMI) 167 connectable with a keyboard 111 and a pointing device/medium 112, a processor 155, a storage device 154, a memory 137, a network interface controller 163 (NIC) connectable with a network 151 including local area networks and internet network, a display interface 161 connected to a display device 165, an input interface 139 connectable with an input device 135, a printer interface 133 connectable with a printing device 131. Further, the NIC 163 includes a signal interface configured to receive measurements 195 from smart sensors 105 arranged in the power distribution system 115 through the communication 180. The memory 137 is configured to load the phase identification program 159 by associating with the storage device 154 when executing the method implemented in 100A. In some cases, the memory 137 and the storage device 154 may be referred to as a memory.

The phase identification system can receive electric signals 195 indicating timeseries measurements of currents of loads arranged in a power distribution system 115 via the network 151 connected to the NIC 163. The network 151 is connected to an outside system(s) 101 that can provide control signals to the power distribution system 115 and associated smart meters 105 installed at the loads 107 in the power distribution systems 115 for performing measurement collecting of the feeder head 109 and loads 107. The feeder head may be multiple header heads 109 if multiple feeders are existing. Further, the phase identification 100B can provide the outside system 101 phase identification data (signals) via the network 151 so that the outside system 101 can trigger data collection associated with smart meters arranged in the power distribution system 115. Further, the phase identification system 100B can be controlled from the outside system 101 by receiving data (signals) of the phase identification system 100B via the network 151.

The storage device 154 includes parameters 158 for phase identification of power distribution system with respect to the power distribution system 115 and a phase identification program module 159. The input device/medium 139 may include modules that read programs stored on a computer readable recording medium (not shown).

For identifying connected phases of loads in the power distribution system 115, the phase identification system 100B may receive the measuring data of the loads 107 and feeder head 109 from the smart meters 105 arranged in the customer sides and the feeder head of the power distribution system 115.

When the phase identification system 100B receives the command from the outside system 101 (such as distribution management system, or distribution control system) to identify all missing phase labels for all loads in the power distribution system 115. It first loads parameters 158 of phase identification from the memory storage unit 154 into the memory 137, then execute the phase identification steps described in mutual information based phase identification program 159. Before implementing the phase identification modules, the phase identification system 100B first identify a set of loads without phase labels and collecting readings of smart meters at the feeder head, and loads with unknown phase labels; then iteratively execute following steps: 1). choosing the load with heaviest current among all loads with undetermined phases as the study load, 2). computing marginal probabilities and joint probability of current exceeding fluctuations for each phase between the study load and the feeder head based on corresponding differential current data, 3). determining the phase for the study load based on mutual information index determined based marginal and joint probability between feeder head and the study load, 4). removing the study load from the set of loads with undetermined phases, and updating feeder head currents by deducting the contribution of currents of the study load from the feeder head currents, and 5). checking if the set of loads with undetermined phases is empty. If no, repeat the steps 1)-5) for next heaviest load. If yes, then the iteration process is completed, and results for phase identification are transmitted through display interface 161 to display on display device 165. Meanwhile, the phase identification results are also submitting to the outside system 101 to update its power distribution system topology model or execute other tasks based on those labeled load phase data.

Power Distribution System and Load Connections

Figure 2A:
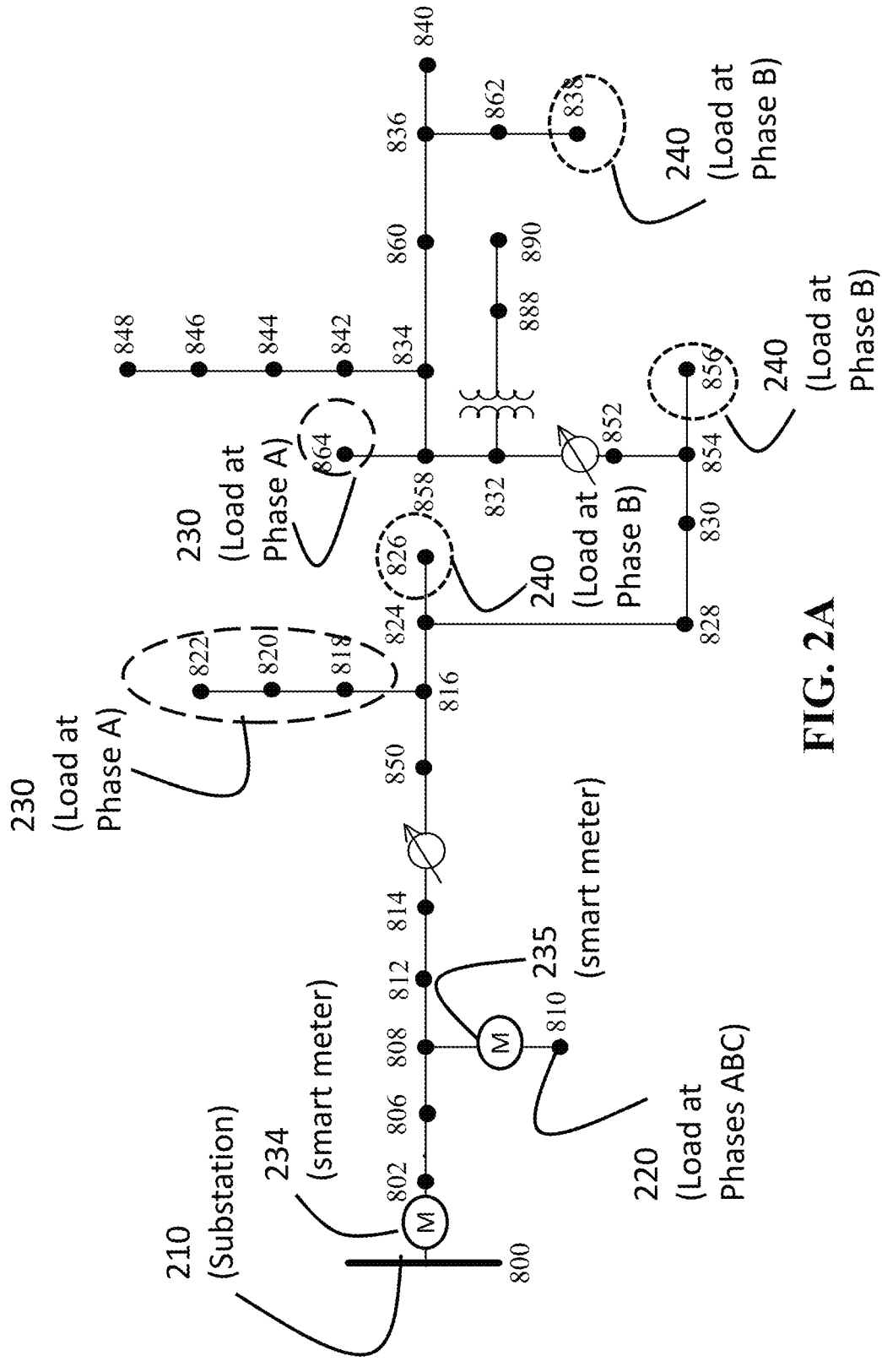
FIG. 2A is a schematic illustrating IEEE 34 bus test system.

FIG. 2A is a schematic illustrating IEEE 34 bus test system. This one-line diagram shows a feeder fed from a substation 210 and then delivered powers to customer loads 220, 230, 240 through distribution lines. It contains both three-phase loads 220, and single-phase loads 230, 240. An advanced sensor or a smart meter 234 is installed at the feeder head. Each load is equipped with a smart meter 235.

Three phase load 220 is a load connected to all three phases A, B, and C. Single-phase load is a load connected only one phase 230, 240. For example, load 230 is connected to single phase A, and load 240 is connected to phase B.

Dependent on power distribution system configuration, the load can connect with the system using wye connection or delta connection.

Figure 2B:
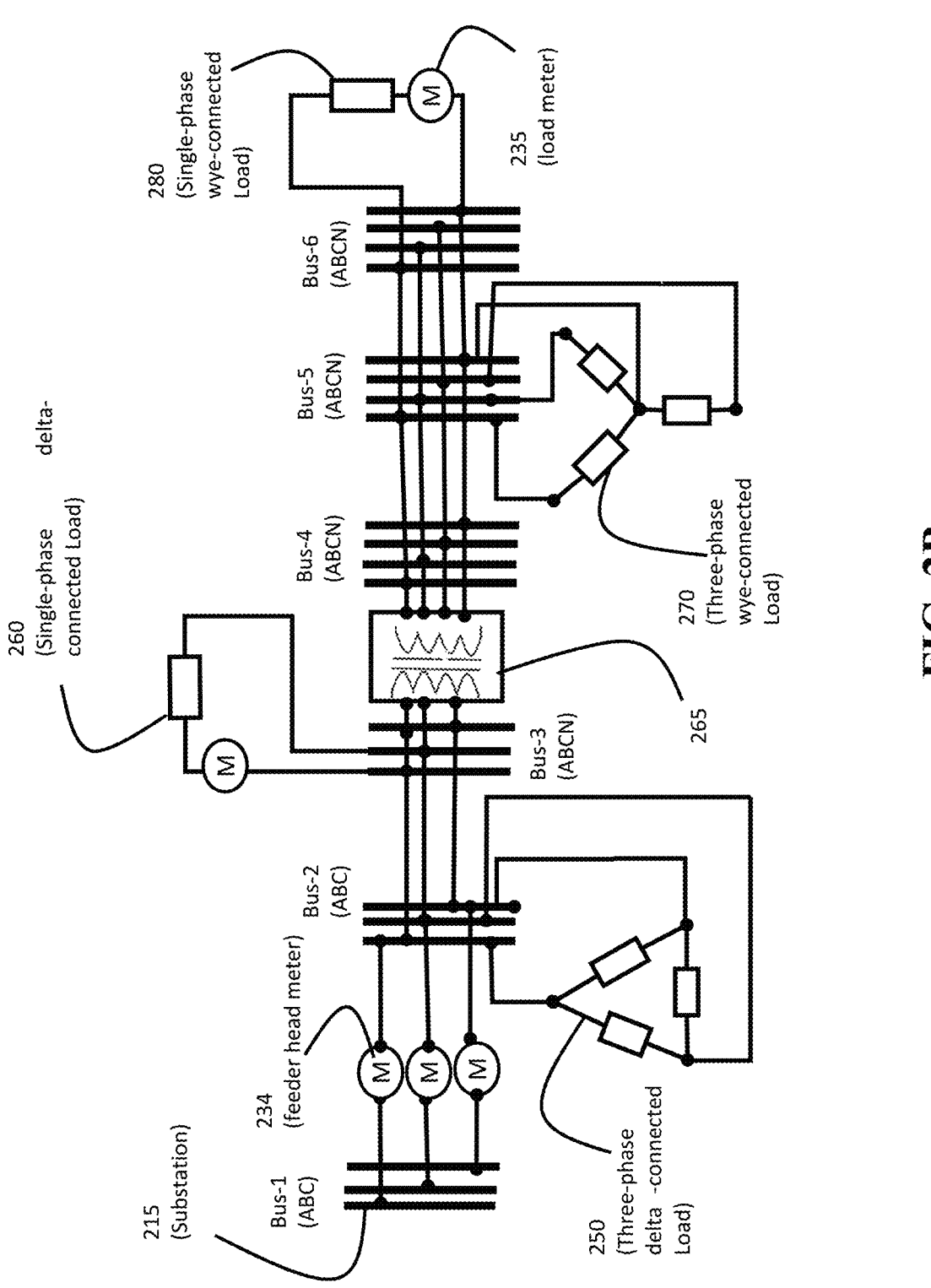
FIG. 2B is a schematic illustrating single-phase loads and three-phase loads with wye and delta connections.

FIG. 2B is a schematic illustrating single-phase loads and three-phase loads with wye and delta connections. The power is fed from a substation bus 215 to customer loads 250, 260, 270 and 280. The smart meters 234 and 235 are installed at the feeder head and loads of the power distribution system 115. The left side of the transformer 265 is a three-phase three-wire system, including wires for phases A, B and C. The right side of the transformer 265 is a three-phase four-wire system, including wires for phases A, B, C and the neutral. In the figure, feeder head has installed 3 smart meters, and one for each phase. Each single-phase load also installed with a smart meter.

Load 250 is a three-phase delta-connected load in which each phase load is connected between two phases. Load 260 is a single-phase delta-connected load which connected between two phases.

Load 270 is a three-phase wye-connected load in which each phase load is connected between one phase and a neutral. Load 280 is a single-phase wye-connected load which connected between a phase and a neutral.

Data Pre-Processing

Consider a power distribution system, where smart meters are installed at a subset of the load buses. The load buses are assumed to be a mixture of wye and delta connections. Each smart meter can provide the following three measurements: real power, reactive power, and the magnitude of voltage. Accordingly, the magnitude of current of load k can be determined at each smart meter, as:

$$I_k = \frac{\sqrt{P_k^2 + Q_k^2}}{V_k}, \forall k \in K \tag{1}$$

where $I_k$ is the magnitude of current of load k, $P_k$ and $Q_k$ are the real power and the reactive power of load k, $V_k$ is the magnitude of voltage of load k, and all values are given in per unit. In addition, all of the data are measured in time series by the smart meters on the customer primary voltage sides with a predefined sampling rate.

Let K be the set of indexes for all loads without phase labels. It is worthy to mention that all two-phase or three-phase load without phase labels are converted into equivalent single-load loads to be considered. A set $\mathbb{I}^{LD}$ is used to combine the time series currents in the given set of measuring intervals T for all the loads as $$\mathbb{I}^{LD} = \left\{ I_k^{LD}(t), t \in T, k \in K \right\} \in \mathbb{R}^{|T| \times |K|}.$$

$|T|$ and $|K|$ are the total numbers of measuring intervals and loads, respectively.

Another advanced sensor on the feeder head can be used to measure the currents in three phases at the feeder head. Note that the three phases are in set $\Phi = \{A, B, C\}$. Here we also use the magnitude of currents at the feeder head and note it as $$I_\phi^{FDR},$$

$\phi \in \Phi$ for different phases and put it into a set $\mathbb{I}^{FDR}$. Given the set of measuring intervals T, we have $$\mathbb{I}^{FDR} = \left\{ I_\phi^{FDR}(t), t \in T, \phi \in \Phi \right\} \in \mathbb{R}^{|T| \times 3}.$$

Since the differential time series data contain potentially useful information, we create the differential set $\Delta \mathbb{I}^{LD}(t) = \mathbb{I}^{LD}(t) - \mathbb{I}^{LD}(t-1)$ and note it as $\Delta \mathbb{I}^{LD} \in \mathbb{R}^{(|T|-1) \times |K|}$. A similar differential process is also used for $\mathbb{I}^{FDR}$ and note as $\Delta \mathbb{I}^{FDR} \in \mathbb{R}^{(|T|-1) \times 3}$.

$\mathbb{I}^{FDR}$ can be a set of actually current measurements over time at the feeder head, or a set of equivalent currents at feeder head contributed by a specified set of loads, such as all loads except a specified load. The equivalent feeder head currents can be computed by deducting the equivalent currents contributed by the specified load from the measured feeder head currents. The equivalent currents contributed by the specified load are computed by assuming voltages at the bus that the load connected to are balanced, that is any two of three phases are 120 degree apart.

The set of measuring intervals, T can strategically be selected according to the penetrations of PVs and smart meters. For example, we can use the time-series data from 1 AM to 6 AM local time to avoid noise caused by PVs.

The next step is to figure out the useful information from both the customer load measurements and the feeder head measurements. There is no doubt that any customer load would have some fluctuations due to its load variation over time (usually represented by a load profile). The fluctuations also show on the feeder head on the same phase.

For example, suppose a customer use an appliance for two minutes from 6:00 to 6:02 AM, the current on the customer side would show an increase fluctuation between 5:59 and 6:00 AM when the customer turns on the appliance. The current would show a decrease fluctuation between 6:02 to 6:03 when the customer turns off the appliance. In the meantime, the sensor on the source side (i.e., at the feeder head) would also capture the same fluctuations if both the customer load and the feeder head meters are synchronized on the same phase.

The question is, how significant are the fluctuations in correct identification of the phase? To answer this question, we first define an event as a fluctuation beyond the range $$[L_k^n, L_k^p]$$

for any given k in the load set K, where:

$$\text{a) } L_k^p = \overline{\Delta \mathbb{I}_k^{LD}} + \sigma\left(\Delta \mathbb{I}_k^{LD}\right) \tag{2a}$$

$$\text{b) } L_k^n = \overline{\Delta \mathbb{I}_k^{LD}} - \sigma\left(\Delta \mathbb{I}_k^{LD}\right) \tag{2b}$$

Note that $$\overline{\Delta \mathbb{I}_k^{LD}}$$

is the mean and $$\sigma\left(\Delta\mathbb{I}_k^{LD}\right)$$

is the standard deviation of signal $$\Delta\mathbb{I}_k^{LD}.$$

From statistics, the probability of a normal distribution is 66.67% in the range of mean value±standard deviation. Since we are more interested in significant fluctuations, we choose only fluctuations that fall beyond the range $$[L_k^n, L_k^p]$$

as "events" to be studied in the present invention.

It should be noticed that the selection of events is crucial because not every point in $$\Delta\mathbb{I}_k^{LD}$$

is useful for phase identification. The same two minutes example of turning on an appliance can be used to explain the reason. If the customer does not turn on other appliances, the PV installed at the customer side has no power supply before sunrise, and the only appliance is working in a fixed power, then no fluctuation will be seen in both the customer side and the feeder head side during the two minutes. In such a case, no event signature can be captured even we compare the same phase from the customer load and the feeder head. Therefore, we can only analyze the load phase if the event signatures are clear in both the customer side and the feeder head side.

Here, we use a relatively simple way to select events, as it was explained in the previous paragraph. Other complex methods, can be used for the purpose of selecting the events, such as by using moving average or least square error. However, from the numerical test in this invention, there does not seem to be a need to make the process of selecting the events unnecessarily complicated.

Mutual Information Among Joint Events

Suppose a joint event at both customer load k and feeder head is beyond the range of $$[L_k^n, L_k^p],$$

it does not mean that the load k and feeder head are on the same phase. For example, if an event at load k shows fluctuation greater than $$L_k^p$$

while the same event at phase $\phi$ of feeder head shows fluctuation less than $$L_k^n,$$

it is highly possible that customer k does not belong to phase $\phi$. However, if an event at both customer load k and phase $\phi$ of the feeder head is greater than $$L_k^p,$$

, it does not mean customer load k belongs to phase $\phi$ because it is possible that different customers have similar load profiles. Therefore, we use cross entropy from the information theory to solve this issue.

Suppose m joint events are chosen between a pair of customer load k and feeder head phase $\phi$ in $\Phi$, we can obtain the probability table as follows:

$$p_{\phi,k}(u, v), \tag{3}$$

$$\text{Where } u = \begin{cases} 1 & \text{if } \forall m: \Delta\mathbb{I}_\phi^{FDR}(m) \geq L_k^p \\ 2 & \text{if } \forall m: \Delta\mathbb{I}_\phi^{FDR}(m) \leq L_k^n \end{cases} \tag{4}$$

$$v = \begin{cases} 1 & \text{if } \forall m: \Delta\mathbb{I}_k^{LD}(m) \geq L_k^p \\ 2 & \text{if } \forall m: \Delta\mathbb{I}_k^{LD}(m) \leq L_k^n \end{cases} \tag{5}$$

Here $p_{\phi,k}(1,1)$ shows that the probability of fluctuations in both feeder head phase $\phi$ and customer load k are greater than $$L_k^p;$$

; $p_{\phi,k}(1,2)$ shows that the probability of fluctuations in the feeder head at phase $\phi$ is greater than threshold $$L_k^p$$

while the fluctuations in the load k is less than the threshold $$L_k^n;$$

$p_{\phi,k}(2,1)$ shows the probability of fluctuations in feeder head phase $\phi$ is less than threshold $$L_k^n$$

while the fluctuations in load k is greater than threshold $$L_k^p;$$

and $p_{\phi,k}(2,2)$ is the probability of fluctuation at less than $$L_k^n$$

in both feeder head at phase $\phi$ and customer load k.

We can transform the data from the joint events m into a probability relationship, such as $p_{\phi,k}(u, v)$ in equation (3), for different relationships between feeder head phase $\phi$ and the load k. Since equation (3) is based on probability, it is possible to have bias, which can be avoided by using enough events. In other words, the larger amount of joint events used, the more accurate the results will be.

For example, we can only analyze the load phase when number of joint events m is not less than 12. Note that the predetermined period in the testing is 7 days as predefined days. Since we use the differential time series data, we have 60 minutes×6 hours minus 1 for a day. The total 2,513 time series differential data is obtained by multiplying the 359 minutes by 7 days. Therefore, the selection of joint events m≥12 is close to 0.5% of the time series data in the predetermined period, which is big enough due to numerical verification in this invention. Suppose we would like a more reliable result, we can set a bigger limitation for m but it also means that some phase of the loads may not be recognized. Note that equation (3) can also be extended into:

$$p_\phi(u), \text{ and } p_k(v), \tag{6}$$

$$\text{Where } p_\phi(u) = \begin{cases} p_{\phi,k}(1, 1) + p_{\phi,k}(1, 2) & \text{if } u = 1 \\ p_{\phi,k}(2, 1) + p_{\phi,k}(2, 2) & \text{if } u = 2 \end{cases} \tag{7a}$$

$$p_k(v) = \begin{cases} p_{\phi,k}(1, 1) + p_{\phi,k}(2, 1) & \text{if } v = 1 \\ p_{\phi,k}(2, 1) + p_{\phi,k}(2, 2) & \text{if } v = 2 \end{cases} \tag{7b}$$

In fact, $p_\phi(u)$ and $p_k(v)$ in equation (6) are the marginal probability of equation (3). $p_\phi(u=1)$ is the probability that events m at feeder head phase $\phi$ are greater or equal to $$L_k^p$$

and $p_\phi(u=2)$ is the probability that events m at feeder head phase $\phi$ are less or equal to $$L_k^n$$

Similarly, $p_k(v=1)$ and $p_k(v=2)$ is the probability that events m at load k are greater or equal to $$L_k^p$$

and less or equal to $$L_k^n,$$

respectively.

One can follow equation (3) and (6) to build the probability table between the phase $\phi$ and load k. After that, an index is needed to figure out which feeder head phase in $\Phi$ is the most related to load k when the load belongs to a wye connection. The mutual information index we use here is summarized as follows:

$$MI(\phi; k) = \sum_{u \in \{1.2\}} \sum_{v \in \{1.2\}} p_{\phi,k}(u, v) \log \frac{p_{\phi,k}(u, v)}{p_\phi(u) p_k(v)} \tag{8}$$

$$\text{Where } \Phi_{k,e} = \arg \max_{\phi \in \Phi} MI(\phi; k) \tag{9}$$

The $\Phi_{ke}$ is the estimated phase of load k in wye connection. It should be noted that the present invention can also be used to recognize the delta connected load by:

$$\Phi'_{ke} = \arg \min_{\phi \in \Phi} MI(\phi; k) \text{ and} \tag{10}$$

$$\Phi_{ke} = \Phi - \Phi'_{ke} \tag{11}$$

As shown above that regarding wye and delta connections, the highest correlated phase is considered as the estimation result for wye and the lowest correlated phase is considered as not the phase for a delta load, respectively.

Additional Details of the Present Invention

It shall be pointed out three additional details with regards to the present invention.

First, it is possible that two cases with the same mutual information index in equation (8), even if both cases are in totally opposite relationships. For example, suppose a probability table U is p(1,1)=0.1, p(1,2)=0.4, p(2,1)=0.4, p(2,2)=0.1, the result will be the same as another table V which is p(1,1)=0.4, p(1,2)=0.1, p(2,1)=0.1, p(2,2)=0.4. Although the resulting values of inputting U and V in equation (8) are the same, they are different in the sense that in V, $\phi$ and k are positively correlated, while in U they are not. Therefore, we will select results with higher value of p(1, 1) and p(2, 2) if two cases have the same results of (8). The reason is that p(1, 1) and p(2, 2) imply that phase $\phi$ and k show the same pattern, which also imply that phase $\phi$ and k can be on the same phase if the load k is in wye connection.

Second, since the present invention focuses on the signal from the feeder head and customer load side, the value of the signal itself can impact the results. In other words, it may be easier to recognize the phase of customers with heavier loads as opposed to customers that consume less power. The reason is because fluctuations during a heavier load can be recognized more easily than those with light loads. To avoid the setback, the present invention identifies the phase from the heaviest load first. After recognizing the phase, we subtract the customer-side current from the corresponding feeder head phase if the customer load is wye connected. If the customer load is delta connected, then we will subtract two corresponding phases from the feeder head side. Then, we calculate the new probability table for the second largest load, and so on. Note that this is a valid assumption because the public utilities should have a power consumption plan when they supply the power to customer loads in the power distribution systems. The heaviest load is selected based a statistic detecting algorithm based on sample means of current magnitude time series of loads in which the load with largest sample mean of current magnitude is chosen.

The feeder head current update process is implemented using a current disaggregation algorithm by assuming three phase angles are balanced, and 120 apart, and three phase angles for voltages with wye-connection are set as $\theta_{V_A}=0°$, $\theta_{V_B}=-120°$, $\theta_{V_C}=120°$. Three phase angles for voltages with delta-connection are set as $\theta_{V_{AB}}=30°$, $\theta_{V_{BC}}=-90°$, $\theta_{V_{CA}}=150°$ The feeder head current before removing any loads are calculated as:

$$\mathbb{i}_\phi^{FDR}(t) = \frac{P_\phi^{FDR}(t) - jQ_\phi^{FDR}(t)}{V_\phi^{FDR}(t)e^{-j\theta_{V_\phi}}}, \tag{12}$$

$$\mathbb{I}_\phi^{FDR}(t) = \left|\mathbb{i}_\phi^{FDR}(t)\right| \quad \phi \in \{A, B, C\}, t \in T$$

Where $$P_\phi^{FDR}(t), Q_\phi^{FDR}(t) \text{ and } V_\phi^{FDR}(t)$$

are the measured real power, reactive power and voltage magnitude at feeder head phase $\phi$ at interval t, and all values in per unit.

$$\mathbb{i}_\phi^{FDR}(t)$$

is the complex current at feeder head phase $\phi$ at interval t, and the feeder head current magnitude used for phase identification, $$\mathbb{I}_\phi^{FDR}(t)$$

is calculated as the absolute value of complex current $$\mathbb{i}_\phi^{FDR}(t)$$

as shown in (12).

The feeder head currents are updated each time when the connected phases of any load originally missing phase label has been determined.

If load k is wye-connected and its phase is determined as $\phi$, the magnitude of current at feeder head on phase $\phi$ at interval t, $$\mathbb{I}_\phi^{FDR}(t)$$

can be updated using (13) by subtracting the contribution of current of load k from the latest feeder head current on phase $\phi$ at interval t:

$$\mathbb{i}_\phi^{FDR}(t) \leftarrow \mathbb{i}_\phi^{FDR}(t) - \frac{P_k^{LD}(t) - jQ_k^{LD}(t)}{V_\phi^{LD}(t)e^{-j\theta_{V_\phi}}}, \tag{13}$$

$$\mathbb{I}_\phi^{FDR}(t) = \left|\mathbb{i}_\phi^{FDR}(t)\right| \quad \phi \in \{A, B, C\}, t \in T$$

Where all values in per unit, $$P_k^{LD}(t), Q_k^{LD}(t) \text{ and } \left|V_k^{LD}\right|(t)$$

are the measured real power, reactive power and voltage magnitude at load k and interval t If load k is delta-connected and its phases are determined as $\phi_1$ and $\phi_2$, the currents at feeder head on phases as $\phi_1$ and $\phi_2$ at interval t, $$\mathbb{I}_{\phi_1}^{FDR}(t)$$

and $$\mathbb{I}_{\phi_2}^{FDR}(t)$$

can be updated using (14) by subtracting the equivalent contributions of current of load k from the measured currents at feeder head phases $\phi_1$ and $\phi_2$:

$$\mathbb{i}_{\phi_1}^{FDR}(t) \leftarrow \mathbb{i}_{\phi_1}^{FDR}(t) - \frac{P_k^{LD}(t) - jQ_k^{LD}(t)}{V_k^{LD}(t)e^{-j\theta_{V_{\phi_1\phi_2}}}}, \tag{14}$$

$$\mathbb{i}_{\phi_2}^{FDR}(t) \leftarrow \mathbb{i}_{\phi_2}^{FDR}(t) - \frac{P_k^{LD}(t) - jQ_k^{LD}(t)}{V_k^{LD}(t)e^{-j\theta_{V_{\phi_1\phi_2}}}},$$

$$\mathbb{I}_{\phi_1}^{FDR}(t) = \left|\mathbb{i}_{\phi_1}^{FDR}(t)\right|,$$

$$\mathbb{I}_{\phi_2}^{FDR}(t) = \left|\mathbb{i}_{\phi_2}^{FDR}(t)\right|, \phi_1\phi_2 \in \{AB, BC, CA\}, t \in T$$

Where all values in per unit, $$P_{\phi_1}^{FDR}(t), Q_{\phi_1}^{FDR}(t) \text{ and } V_{\phi_1}^{FDR}(t),$$

and $$P_{\phi_2}^{FDR}(t), Q_{\phi_2}^{FDR}(t) \text{ and } V_{\phi_2}^{FDR}(t)$$

are the measured real powers, reactive powers and voltage magnitudes at feeder head phases $\phi_1$ and $\phi_2$ at interval t, respectively.

Third, the use of cross entropy in the present invention can perform better than the traditional use of cross correlation. Correlation is a linear relationship. However, the relationship between the load k and its corresponding feeder head phase could be positively related but not linearly related. Thus, it is better to use cross entropy to solve the problem as we proposed here.

Test Results of an Exemplar System

The IEEE 34 bus test system as shown in FIG. 2A is used as an exemplar system to demonstrate the usage of the present invention. This system includes thirty loads, half in wye connection and half in delta connection. A set of sample load profiles with size of 100 have been used to simulate the load variations for the loads. Since the IEEE 34 test system only has thirty loads while the sample load profiles have one hundred load profiles, we shuffle the load profiles and assign random ones to the loads in the IEEE 34 test system in the same day with the power factor set at 0.95.

The IEEE 34 test system did not include PV inverters. Therefore, we add PVs at each bus with the penetration rate from 0% to 100%. Note that each PV rated power is 250 kW. It takes irradiation and temperature as inputs.

Figure 3:
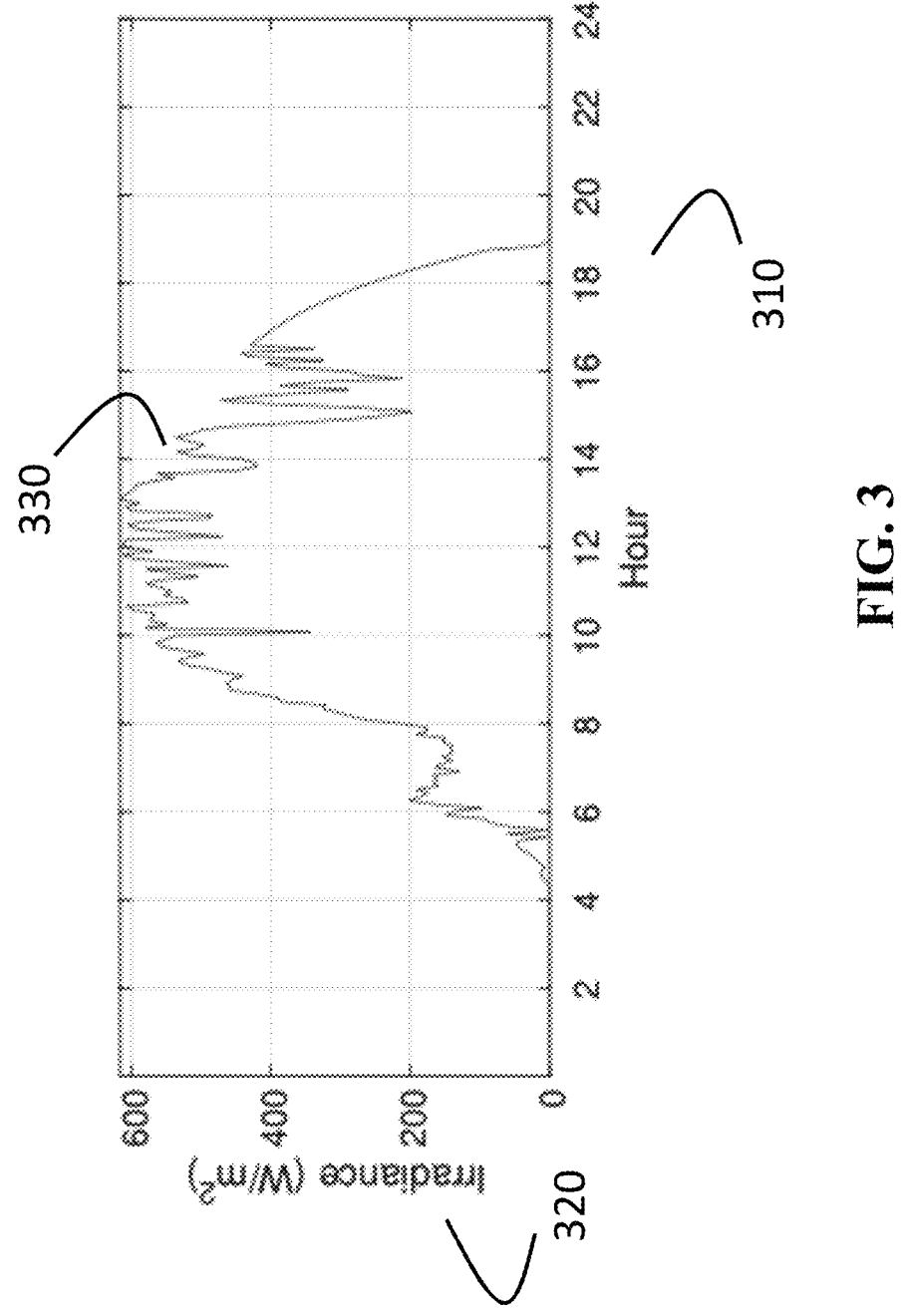
FIG. 3 is a schematic illustrating a typical solar irradiance variation within 24 hours of a typical day.

FIG. 3 is a schematic illustrating a typical solar irradiance variation within 24 hours of a typical day. The horizontal axis 310 represent the hour of the day, and the vertical axis 320 represents the irradiance measured in watt per squared meter. The curve 330 displays the variation of solar irradiance over the hour of the day.

Considering the sizes of geographic area for a power distribution system should be limited, the same weather conditions are used for all PVs and the PVs are behind-the-meter (i.e. we cannot see the power and current generated by the PVs). All the simulations are conducted by using on Simulink.

We will use advanced smart meters that can record not only real power but also reactive power and magnitude of voltage per minute to identify phases of loads. The above-described mutual-information based approach is applied to recognize the phase of a wye or a delta load under different PV penetration rates when a power distribution system is mixture with wye and delta loads. Different scenarios that may impact the accuracy of the present invention are analyzed, including the penetration rate of smart meters, change of the measurement rate, and the measurement error of the smart meter.

Different PV Penetration Rates with Different Time Period

Table I shows the results of the present invention applied to Different PV Penetration Rates with Different Time Period. The PV penetration rate is 0%, 33.3%, 66.7%, and 100%, corresponding to PVs are 0, 10, 20, and 30 out of all 30 loads in the IEEE 34 bus test system.

The accuracy is 100% for all the PV penetration rates when the present invention works with the time series differential data from 1 AM to 6 AM. The main reason is that PVs have less impacts to the event signature due to less irradiance as shown in FIG. 3 while the present invention can still recognize the event signatures between the feeder head and customer-side. The results of a different period, 11 AM to 16 PM, are also listed in the same table to show the impact of PVs. Although the present invention can still work with 100% accuracy when no PV installed, the accuracy of the present invention can decrease to 60% with PVs. The main reason is that the present invention depends on the event signature and the contribution of behind-the-meter PVs can bring challenges to identify the phase. One may noticed that the accuracy decrease to 60% when the PV penetration rate is 66.7% but increase to 70% when the PV penetration rate is 100%. A possible reason is that the simulation in this study assumes all the PVs in the IEEE 34 bus test system have the same irradiation and temperature input. This assumption may help the present invention separate loads profile easily when the PV penetration rate is 100%. For the rest of the analysis in different factors that have different challenges, we use the time series differential data from 1 AM to 6 AM for analysis.

TABLE I

Accuracy of the present invention on different pv penetration rate in different period

| PV Penetration | Data Period | |
|---|---|---|
| Rate (%) | 1 AM to 6 AM | 11 AM to 16 PM |
| 0 | 100.0 | 100.0 |
| 33.3 | 100.0 | 86.7 |
| 66.7 | 100.0 | 60.0 |
| 100.0 | 100.0 | 70.0 |

Different Smart Meters' Penetration Rates

TABLE II

Accuracy with different smart meter(SM) penetration rate

| SM Penetration rate (%) | 96.7 | 67.7 | 33.3 | 3.3 |
|---|---|---|---|---|
| Average Accuracy (%) | 99.7 | 99.1 | 98.2 | 98.0 |

Since in the present invention, we remove the corresponding current on the feeder head once we identify the phase on the customer load side, it may be interesting to know the accuracy if the smart meter penetration rate is not 100%. We want to find out how the present invention will perform if we cannot remove the current from the corresponding phase. Here, 100 tests are run with different penetration rates of smart meters (SM). Note that in the 100 tests, the deployment of smart meters are randomly picked. When SM penetration rate is 96.7%, it means only one load in the IEEE 34 bus test system is not using smart meter. When SM penetration rate is 3.3%, it means that only one load in the IEEE 34 bus test system has smart meter. The results are listed in Table II. In the worst case where SM penetration rate is 3.3%, the average accuracy is 98%, which shows the present invention can work even if only one customer uses the smart meter.

Results with Different Measurement Rate in Smart Meters

One limitation of the present invention is its reliance on the high measurement rate of smart meters (i.e. per minute measurement or 60 readings per hour) which capture more fluctuations on both the customer load and the feeder head. It is estimated that the present invention will yield less satisfying results as the measurement rate decrease. Here we use the same IEEE 34 bus system with different measurement rates to show the impact. Two lower measurement rates are selected, which are 20 and 12 readings per hour, corresponding to readings of every three and five minutes. Note that these are accumulated readings and therefore, the fluctuations between the current reading and the previous reading will be smaller and less frequent in every three and five minutes as opposed to in every minute. The results are shown in Table III.

TABLE III

| accuracy with different smart meter measurement rates | | | |
|---|---|---|---|
| Measurement Rate Per Hour | 60 | 20 | 12 |
| Accuracy (%) | 100.0 | 90.0 | 76.7 |

Figure 4A:
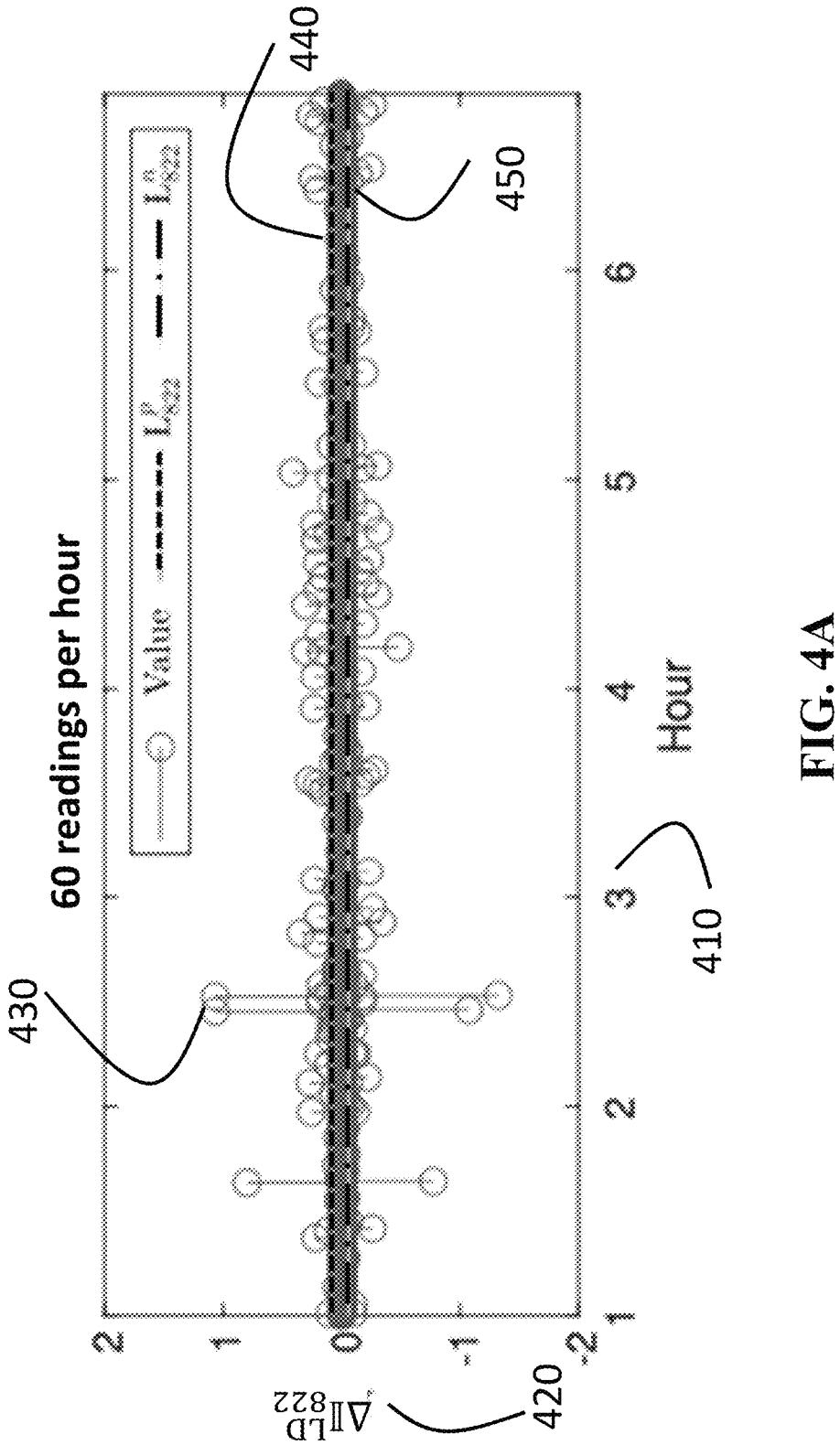
FIG. 4A is a schematic illustrating meter readings for a bus 822 of the IEEE 34 bus test system with measurement rates as 60 readings per hour, according to embodiments of the present disclosure.

FIG. 4A is a schematic illustrating meter readings for a bus 822 of the IEEE 34 bus test system with measurement rates as 60 readings per hour, according to embodiments of the present disclosure. The horizontal axis 410 represent the hour of the day, and the vertical axis 420 represents the current magnitude of bus 822. The circles 430 represent the measurements collected at 60 readings per hour.

Figure 4B:
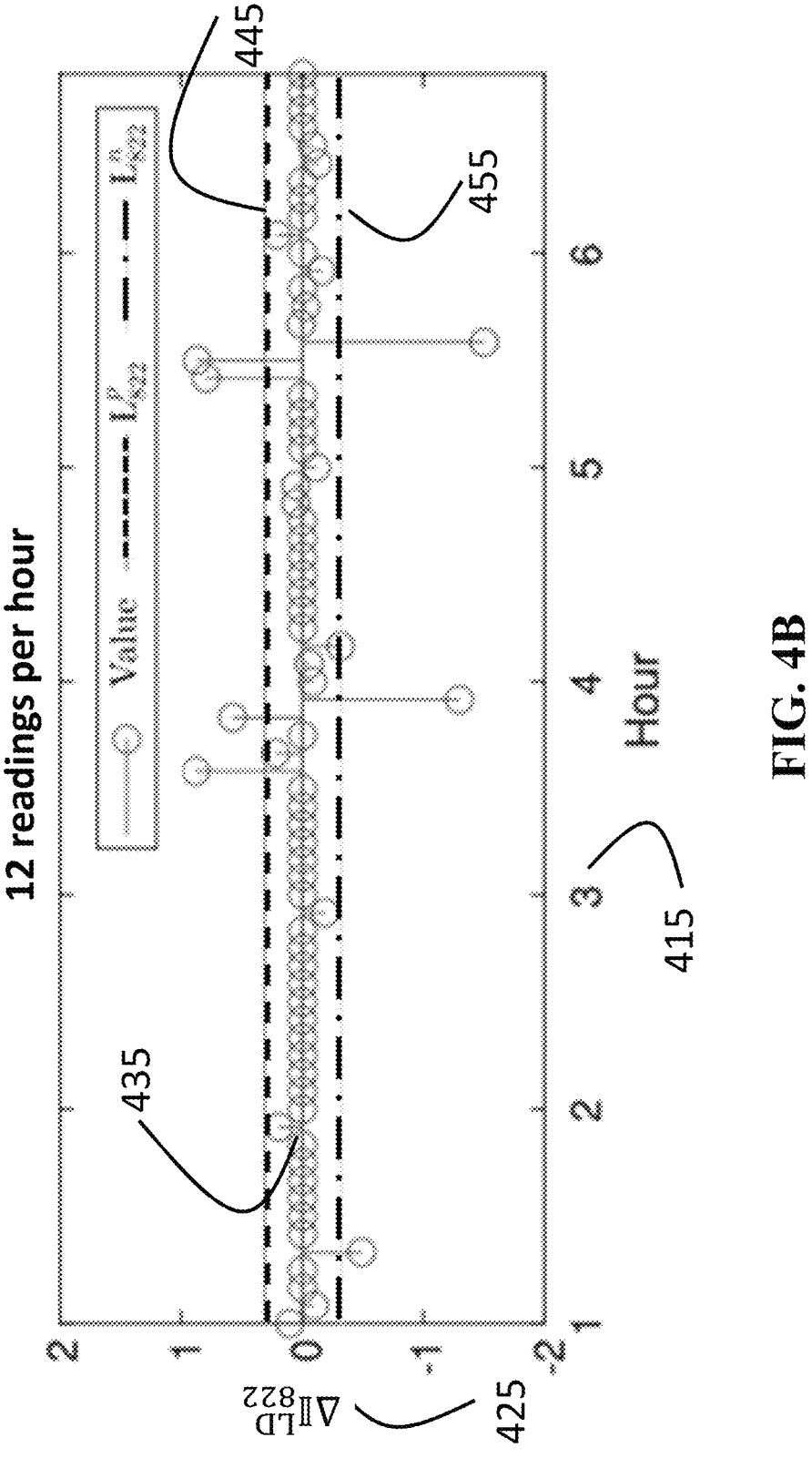
FIG. 4B is a schematic illustrating meter readings for a bus 822 of the IEEE 34 bus test system with measurement rates as 12 readings per hour, according to embodiments of the present disclosure.

FIG. 4B is a schematic illustrating meter readings for a bus 822 of the IEEE 34 bus test system with measurement rates as 12 readings per hour, according to embodiments of the present disclosure. The horizontal axis 415 represent the hour of the day, and the vertical axis 425 represents the current magnitude of bus 822. The circles 435 represent the measurements collected at 12 readings per hour.

The accuracy decreases from 100% to 90.0% and 76.7%. An example of bus 822 in FIGS. 4A and 4B convince that $$\Delta I_{822}^{LD}$$

will be less events beyond $$[L_k^p, L_k^n]$$

when the measurement rate is lower. When the event m is less, the present invention can be less accurate. It is due to the fact that the fluctuations are not significant enough for the present invention to identify the phase.

Measurement Error at Smart Meters

Measurement error is possible for all kind of sensors. It is also important to know the impacts of measurement error on the present invention. Here we assume the measurement error in the smart meter is a normal distribution with zero mean and the standard deviations are 0.01, 0.05, and 0.1. With 100 Monte Carlo tests, the average accuracy of the present invention is summarized as Table IV below. The average accuracy will drop to 97.2%, 90.4%, and 68.9%, corresponding to different standard deviation of error measurement.

TABLE IV

| Accuracy with different smart meter measurement error | | | |
|---|---|---|---|
| Measurement Error (S.D.) | 0.01 | 0.05 | 0.1 |
| Average Accuracy (%) | 97.2 | 90.4 | 68.9 |
| Lowest Accuracy (%) | 96.7 | 80.0 | 60.0 |

Comparison with Cross Correlation and kNN

Next, we compare the present invention with correlation and kNN (k nearest neighbor, note that we add a bar to avoid confusion to the customer load k). Since the load can be either a wye or delta connection, we should explain how we use correlation and kNN to solve the problem.

For correlation, we use the same process, including using the same differential time series data and removing the corresponding current after the phase is recognized. Regarding wye and delta connections, the highest correlated phase is considered as the estimation result for wye and the lowest correlated phase is considered as not the phase for a delta load, respectively.

For kNN method, we build the data set using the same differential time series data. By considering the combination of different feeder head phases and load k, we label the correct combination as 1 and incorrect one as 0. The dimension of the data set for the kNN is $\in R^{5027 \times 90}$. The dimension of 5,027 is twice of the time series differential data we used in the present invention (i.e. 2,513) add 1 due to the label. The dimension of 90 comes from the combination of 30 loads×3 phases. The data set is divided into 80% in a training set and 20% in a testing set.

Figure 5:
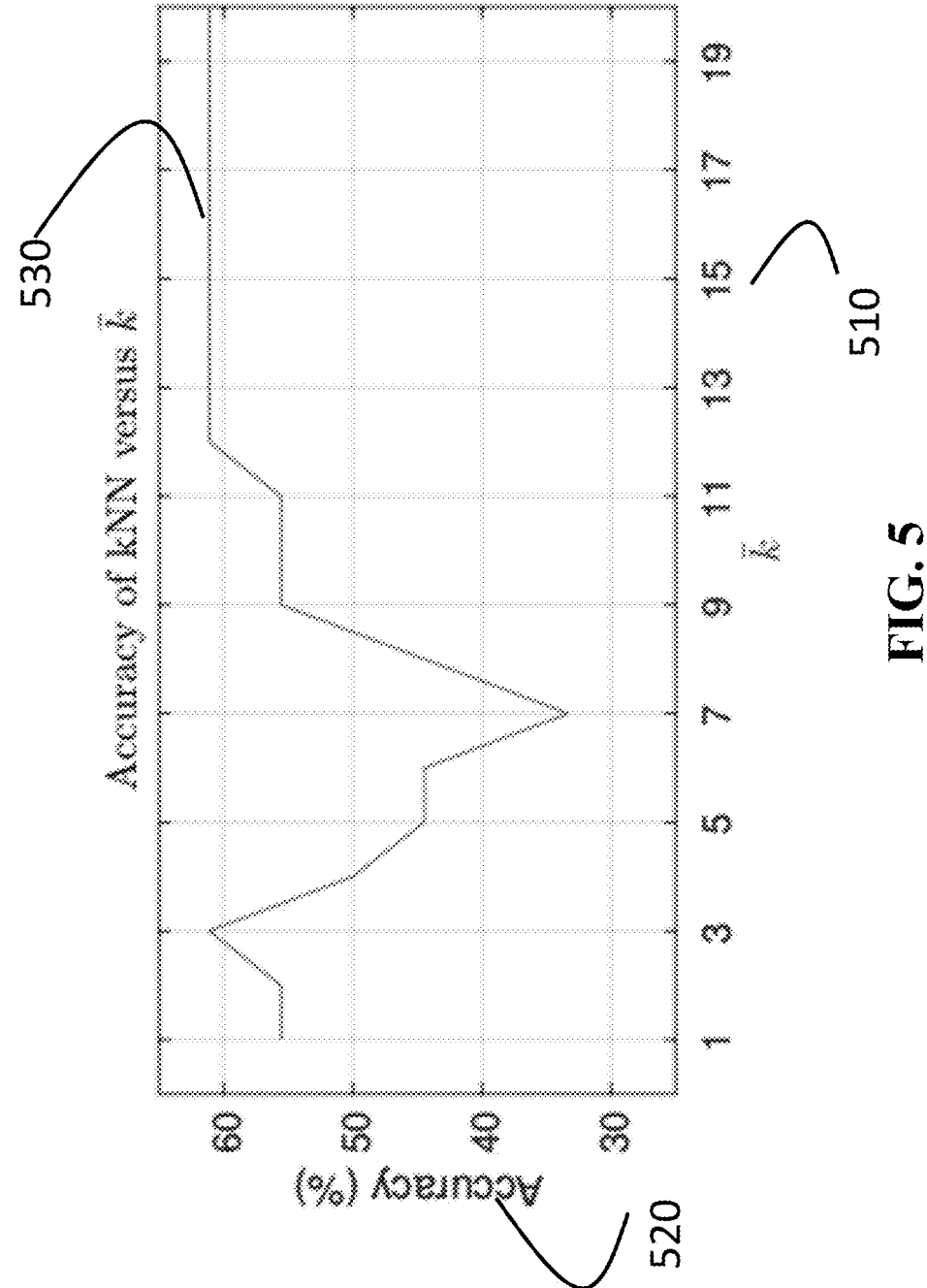
FIG. 5 is a schematic illustrating a comparative results obtaining by using a kNN algorithm with different number of neighbors, according to embodiments of the present disclosure.

FIG. 5 is a schematic illustrating a comparative results obtaining by using a kNN algorithm with different number of neighbors, according to embodiments of the present disclosure. The horizontal axis 510 represent the number of neighbors, and the vertical axis 520 represents the accuracy of phase identification. The curve 530 represents the accuracy variation with the number of neighbors.

A preliminary search of $\bar{k}=3$ shows in FIG. 5. The data set is shuffled every time before run kNN.

The results for all three methods are shown in Table V based on the averaging of the results across one hundred cases. As we can see, the present invention provides a significantly higher accuracy. Note that, in the kNN process, the current is not removed from the feeder head once we obtain the phase of load.

TABLE V

| Accuracy of different methods | | | |
|---|---|---|---|
| Method | Proposed Method | Correlation | kNN |
| Average Accuracy (%) | 100.0 | 83.3 | 59.7 |

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

What is claimed is:

1. A phase detecting system for detecting phases of loads in a power distribution system, comprising:

a signal interface configured to receive measurements from sensors connected to feeder heads and loads on the power distribution system, wherein the measurements include a real power, a reactive power, and a voltage magnitude for each phase of the feeder heads and each phase of the loads, wherein the loads include a set of loads with undetermined phases;

at least one processor; and a non-transitory computer-readable medium having stored thereon a set of instructions for detecting phases of the loads, which when performed by the at least one processor, causes the at least one processor to performs steps of:

storing, by selecting from the measurements, for a set of time intervals, current magnitude timeseries for each phase of the feeder heads and each phase of the loads with undetermined phases in a memory, wherein the current magnitude timeseries include current magnitudes at measured time intervals, wherein the current magnitudes are computed from the real powers, the reactive powers, and the voltage magnitudes, wherein each of the real powers, each of the reactive powers, and each of the voltage magnitudes corresponds to an interval among the set of measuring intervals;

selecting a load indicating a greatest current magnitude from the set of loads with undetermined phases as a study load by a statistic detecting algorithm;

determining exceeding current fluctuation events from the current magnitude timeseries at each phase of the feeder heads and the study load based on a threshold current range;

computing a first marginal probability distribution for the exceeding current fluctuation events on each phase of the feeder heads, a second marginal probability distribution for the exceeding current fluctuation events at the study load, and a joint probability distribution for joint exceeding current fluctuation events for each combination of phases of the feeder heads and the study load;

determining a phase for the study load based on dependence of each phase of the feeder heads on the study load according to mutual information index determined by the first and second marginal probability distributions of the exceeding current fluctuation events and the joint probability distribution of the joint exceeding current fluctuation events;

updating the current magnitude timeseries at the feeder heads by a current disaggregation algorithm for equivalent current of the study load based on measured real powers, reactive powers and voltage magnitudes at the study load, and removing the study load from the set of loads with undetermined phases stored in the memory; and determining if there is a load indicating an undetermined phase in the set of loads with undetermined phases in the memory, then continuing the steps of the selecting through the updating until the set of loads with undetermined phase becomes empty, otherwise generating and outputting a dataset of the determined phases for loads.

2. The phase detecting system of claim 1, wherein the receiving is initiated by transmitting a command signal to the sensors using the signal interface.

3. The phase detecting system of claim 1, wherein the set of time intervals is defined as a collection of measuring intervals of smart meters for predefined days and a predefined range of hours of a day based on sampling rates of the sensors.

4. The phase detecting system of claim 1, wherein the power distribution system includes single-phase loads, two-phase loads, three-phase loads, or a combination thereof.

5. The phase detecting system of claim 1, the set of loads with undetermined phases include single phase loads, equivalent single phase loads converted from two-phase loads, and equivalent single phase loads converted from three-phase loads.

6. A phase detecting method for detecting phases of loads in a power distribution system, comprising steps of:

receiving measurements from sensors via a signal interface, wherein the sensors are connected to feeder heads and loads on the power distribution system, wherein the measurements include a real power, a reactive power, and a voltage magnitude for each phase of the feeder heads and each phase of the loads, wherein the loads include a set of loads with undetermined phases;

storing, by use of the measurements, for a set of time intervals, current magnitude timeseries for each phase of the feeder heads and each phase of the loads with undetermined phases in a memory, wherein the current magnitude timeseries include current magnitudes at measured time intervals, wherein the current magnitudes are computed from the real powers, the reactive powers, and the voltage magnitudes, wherein each of the real powers, each of the reactive powers, and each of the voltage magnitudes corresponds to an interval among the set of measuring intervals;

selecting a load indicating a greatest current magnitude from the set of loads with undetermined phases as a study load by a statistic detecting algorithm;

determining exceeding current fluctuation events from the current magnitude timeseries at each phase of the feeder heads and the study load based on a threshold current range;

computing a first marginal probability distribution for the exceeding current fluctuation events on each phase of the feeder heads, a second marginal probability distribution for the exceeding current fluctuation events at the study load, and a joint probability distribution for joint exceeding current fluctuation events for each combination of phases of the feeder heads and the study load;

determining a phase for the study load based on dependence of each phase of the feeder heads on the study load according to mutual information index determined by the first and second marginal probability distributions of the exceeding current fluctuation events and the joint probability distribution of the joint exceeding current fluctuation events;

updating the current magnitude timeseries at the feeder heads by a current disaggregation algorithm for equivalent current of the study load based on measured real powers, reactive powers and voltage magnitudes at the study load, and removing the study load from the set of loads with undetermined phases stored in the memory; and determining if there is a load indicating an undetermined phase in the set of loads with undetermined phases in the memory, then continuing the steps of the selecting through the updating until the set of loads with undetermined phase becomes empty, otherwise generating and outputting a dataset of the determined phases for loads.

7. The phase detecting method of claim 6, wherein the receiving is initiated by transmitting a command signal to the sensors using the signal interface.

8. The phase detecting method of claim 6, wherein the set of time intervals is defined as a collection of measuring intervals of smart meters for predefined days and a predefined range of hours of a day based on sampling rates of the sensors.

9. The phase detecting method of claim 6, wherein the power distribution system includes single-phase loads, two-phase loads, three-phase loads, or a combination thereof.

10. The phase detecting method of claim 9, wherein the set of loads with undetermined phases are single-phase loads connected between a phase and a neutral when a wye-connection is applied, or connected between two phases when a delta-connection is applied.

11. The phase detecting method of claim 6, the set of loads with undetermined phases include single phase loads, equivalent single phase loads converted from two-phase loads, and equivalent single phase loads converted from three-phase loads.

12. The phase detecting method of claim 6, wherein the statistic detecting algorithm selects the load indicating a greatest current magnitude based on sample means of current magnitudes from the set of loads with undetermined phases.

13. The phase detecting method of claim 6, wherein the current disaggregation algorithm calculates each of the current magnitude timeseries of the feeder heads at phase $\phi$ interval t, $$\mathbb{I}_\phi^{FDR}(t)$$

as absolute value of a corresponding complex current at phase $\phi$ interval t, $$\mathbb{i}_\phi^{FDR}(t), \mathbb{I}_\phi^{FDR}(t) = \left|\mathbb{i}_\phi^{FDR}(t)\right|;$$

wherein complex current, $$\mathbb{i}_\phi^{FDR}(t)$$

is calculated by dividing a conjugate of complex power at phase $\phi$ interval t by a conjugate complex voltage at phase $\phi$ interval t, $$\mathbb{i}_\phi^{FDR}(t) = \frac{P_\phi^{FDR}(t) - jQ_\phi^{FDR}(t)}{V_\phi^{FDR}(t)e^{-j\theta_{V_\phi}}};$$

wherein complex power is defined as $$P_\phi^{FDR}(t) + jQ_\phi^{FDR}(t), P_\phi^{FDR}(t) \text{ and } Q_\phi^{FDR}(t)$$

are measured real power and reactive power at phase $\phi$ interval t; wherein the complex voltage is defined by a magnitude $$V_\phi^{FDR}(t)$$

and voltage phase angle on phase $\phi$, $\theta_{V_\phi}$; wherein $$V_\phi^{FDR}(t)$$

is a measured voltage magnitude at phase $\phi$ interval t; wherein $\theta_{V_\phi}$ is set as $0°$ when $\phi$=A, $-120°$, when $\phi$=B and $120°$ when $\phi$=C; wherein A, B and C are candidate wye-connected phase for the power distribution system.

14. The phase detecting method of claim 13, wherein the current disaggregation algorithm updates the current magnitude of the feeder heads at phase $\phi$ interval t, $$\mathbb{I}_\phi^{FDR}(t)$$

by subtracting the contribution of current of the study load k at phase $\phi$ interval t when load k is wye-connected and its phase is determined as $\phi$; wherein the updated current magnitude of phase $\phi$ interval t, $$\mathbb{I}_\phi^{FDR}(t)$$

is calculated as absolute value of a corresponding updated complex current at phase $\phi$ interval t, $$\mathbb{i}_\phi^{FDR}(t), \mathbb{I}_\phi^{FDR}(t) = \left|\mathbb{i}_\phi^{FDR}(t)\right|;$$

wherein the updated complex current is calculated as deducting equivalent current at load k from the latest complex current of feeder head on phase $\phi$ at interval $$\mathbb{i}_\phi^{FDR}(t) \leftarrow \mathbb{i}_\phi^{FDR}(t) - \frac{P_k^{LD}(t) - jQ_k^{LD}(t)}{V_k^{LD}(t)e^{-j\theta_{V_\phi}}};$$

wherein $$P_k^{LD}(t), Q_k^{LD}(t) \text{ and } V_k^{LD}(t)$$

are measured real power, reactive power and voltage magnitude at load k and interval t.

15. The phase detecting method of claim 13, wherein the current disaggregation algorithm updates the current magnitudes of the feeder heads at phase $\phi_1$ and phase $\phi_2$ of interval t, $$\mathbb{I}_{\phi_1}^{FDR}(t) \text{ and } \mathbb{I}_{\phi_2}^{FDR}(t)$$

by subtracting the contributions of currents of the study load k when load k is delta-connected and its phases are determined as $\phi_1$ and $\phi_2$; wherein the updated current magnitude of phase $\phi_1$ and phase $\phi_2$ of interval t, $$\mathbb{I}_{\phi_1}^{FDR}(t) \text{ and } \mathbb{I}_{\phi_2}^{FDR}(t)$$

is calculated as absolute values of corresponding updated complex currents at phase $\phi_1$ and phase $\phi_2$ of interval t, $$\mathbb{I}_{\phi_1}^{FDR}(t) \text{ and } \mathbb{I}_{\phi_2}^{FDR}(t), \mathbb{I}_{\phi_1}^{FDR}(t) = \left|\mathbb{I}_{\phi_1}^{FDR}(t)\right|, \mathbb{I}_{\phi_2}^{FDR}(t) = \left|\mathbb{I}_{\phi_2}^{FDR}(t)\right|;$$

wherein the updated complex currents are calculated as deducting the contribution of equivalent currents at load k from the latest complex currents of feeder head on at phase $\phi_1$ and phase $\phi_2$ of interval t, $$\mathbb{I}_{\phi_1}^{FDR}(t) \leftarrow \mathbb{I}_{\phi_1}^{FDR}(t) - \frac{P_k^{LD}(t) - jQ_k^{LD}(t)}{V_k^{LD}(t)e^{-j\theta_{V_{\phi_1\phi_2}}}},$$

$$\mathbb{I}_{\phi_2}^{FDR}(t) \leftarrow \mathbb{I}_{\phi_2}^{FDR}(t) - \frac{P_k^{LD}(t) - jQ_k^{LD}(t)}{V_k^{LD}(t)e^{-j\theta_{V_{\phi_1\phi_2}}}};$$

wherein $$P_{\phi_1}^{FDR}(t), Q_{\phi_1}^{FDR}(t) \text{ and } V_{\phi_1}^{FDR}(t),$$

and $$P_{\phi_2}^{FDR}(t), Q_{\phi_2}^{FDR}(t) \text{ and } V_{\phi_2}^{FDR}(t)$$

are the measured real powers, reactive powers and voltage magnitudes at feeder head phases $\phi_1$ and $\phi_2$ at interval t, respectively; wherein $\theta_{V_{\phi_1\phi_2}}$ is a phase angle for voltage between phase $\phi_1$ and phase $\phi_2$, and set as 30° when $\phi_1\phi_2$=AB, −90° when $\phi_1\phi_2$=BC, and 150° when $\phi_1\phi_2$=CA; wherein AB, BC and CA are candidate delta-connected phases for the power distribution system.

16. The phase detecting method of claim 6, wherein the connected phase of load k, $\Phi_{ke}$ is determined as the phase with highest dependence of the phase of the feeder head on load k among three phases $\Phi$={A, B, C} if load k is a wye-connected single-phase load:

$$\Phi_{ke} = \arg_{\phi \in \Phi}(\max) MI(\phi; k)$$

wherein MI($\phi$; k) is an index to assess the dependence of phase $\phi$ of feeder head on the load k.

17. The phase detecting method of claim 6, wherein the connected phases of load k, $\Phi_{ke}$ are determined as the remaining phases by removing the phase with lowest dependence of feeder head on load k from the full set of three phases $\Phi$={A, B, C} if the load is a delta-connected single-phase load:

$$\Phi_{ke} = \Phi - \arg_{\phi \in \Phi}(\min) MI(\phi; k)$$

wherein MI($\phi$; k) is an index to assess the dependence of phase $\phi$ of feeder head on the load k.

18. The phase detecting method of claim 6, wherein the dependence of feeder head on load k for a given phase $\phi$ is defined using a mutual information index, MI($\phi$; k) calculated by:

$$MI(\phi; k) = \sum_{u \in \{1,2\}} \sum_{v \in \{1,2\}} p_{\phi,k}(u, v) \log \frac{p_{\phi,k}(u, v)}{p_\phi(u)p_k(v)},$$

wherein u represents an exceeding current fluctuation event at feeder head on phase $\phi$, v represents an exceeding current fluctuation event at load k; wherein 1 stands for an upper-bound exceeding current fluctuation event, and 2 stands for an lower-bound exceeding current fluctuation event; $p_\phi(u)$ is the marginal probability of exceeding current fluctuation events u occurred at the feeder head on phase $\phi$, $p_k(v)$ is the marginal probability of exceeding current fluctuation events v occurred at load k, $p_{\phi,k}(u, v)$ is the joint probability of exceeding current fluctuation events occurred at both phase $\phi$ of feeder head and load k.

19. The phase detecting method of claim 6, wherein the exceeding current fluctuation event is occurred at a time interval t at phase $\phi$ of feeder head if the differential current at feeder head $$\Delta\mathbb{I}_\phi^{FDR}(t)$$

is beyond a range of thresholds, $$[L_k^n, L_k^p]$$

defined for a given load k; wherein an upper-bound exceeding current fluctuation event is occurred if $$\Delta\mathbb{I}_\phi^{FDR}(t) \geq L_k^p;$$

wherein a lower-bound exceeding current fluctuation event is occurred if $$\Delta\mathbb{I}_\phi^{FDR}(t) \leq L_k^n;$$

wherein differential current at time interval t, $$\Delta\mathbb{I}_\phi^{FDR}(t)$$

is the deviation of current magnitudes at phase $\phi$ of the feeder head between interval t and interval (t−1).

20. The phase detecting method of claim 6, wherein the exceeding current fluctuation event is occurred at a time interval t at load k if the differential current at load k, $$\Delta I_k^{LD}(t)$$

is beyond a range of thresholds, $$[L_k^n, L_k^p]$$

defined for load k; wherein an upper-bound exceeding current fluctuation event is occurred if $$\Delta I_k^{LD}(t) \geq L_k^p;$$

wherein a lower-bound exceeding current fluctuation event is occurred if $$\Delta I_k^{LD}(t) \leq L_k^n;$$

wherein differential current at time interval t, $$\Delta I_k^{LD}(t)$$

is the deviation of current magnitudes at load k between interval t and interval (t−1).

21. The phase detecting method of claim 6, wherein the exceeding current fluctuation event is determined based on a range of thresholds, $$[L_k^n, L_k^p];$$

wherein $$L_k^p = \overline{\Delta I_k^{LD}} + \sigma(\Delta I_k^{LD}), \; L_k^n = \overline{\Delta I_k^{LD}} - \sigma(\Delta I_k^{LD});$$

wherein $$\overline{\Delta I_k^{LD}} \sigma \text{ and } (\Delta I_k^{LD})$$

are the mean and the standard deviation of differential current magnitude for the time series $$\Delta I_k^{LD}$$

over the set of measuring intervals.

* * * * *